(12) United States Patent
Ming et al.

(10) Patent No.: US 10,495,936 B2
(45) Date of Patent: Dec. 3, 2019

(54) PIXEL STRUCTURE, ARRAY SUBSTRATE AND DISPLAY DEVICE

(71) Applicant: Wuhan China Star Optoelectronics Technology Co., Ltd., Wuhan, Hubei (CN)

(72) Inventors: Xing Ming, Guangdong (CN); Zhiyuan Shen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 16/113,152

(22) Filed: Aug. 27, 2018

(65) Prior Publication Data

US 2018/0364536 A1 Dec. 20, 2018

Related U.S. Application Data

(62) Division of application No. 14/783,927, filed on Oct. 12, 2015, now Pat. No. 10,088,723.

(51) Int. Cl.
*G02F 1/1362* (2006.01)
*G02F 1/1368* (2006.01)
(Continued)

(52) U.S. Cl.
CPC ...... *G02F 1/136286* (2013.01); *G02F 1/1368* (2013.01); *G02F 1/13338* (2013.01); *G02F 1/134336* (2013.01); *G02F 1/136227* (2013.01); *H01L 27/124* (2013.01); *G02F 2001/134354* (2013.01); *G02F 2001/134372* (2013.01); *G02F 2001/136295* (2013.01); *G02F 2201/123* (2013.01); *G02F 2202/104* (2013.01);
(Continued)

(58) Field of Classification Search
CPC ............ G02F 1/136286; G02F 1/1368; G02F 1/13338; G02F 1/134336; G02F 1/136227; G02F 2001/134372; G02F 2001/134354; G02F 2001/136295; G02F 2202/104; H01L 27/124; H01L 29/78678; G06F 3/0412; G06F 3/044; G06F 2203/04103
USPC .......................................................... 349/12
See application file for complete search history.

(56) References Cited

U.S. PATENT DOCUMENTS

2007/0126969 A1* 6/2007 Kimura ............ G02F 1/134363
349/141
2009/0147203 A1 6/2009 Tomihari
2013/0057793 A1 3/2013 Uchida

FOREIGN PATENT DOCUMENTS

CN 103926765 A 7/2014
CN 104503172 A 4/2015
CN 104505391 A 4/2015

* cited by examiner

*Primary Examiner* — Charles S Chang
(74) *Attorney, Agent, or Firm* — Andrew C. Cheng (57) ABSTRACT

A pixel structure includes scan lines, data lines and pixel areas. The scan lines are separately arranged in parallel in a horizontal direction. The data lines are separately arranged in parallel in a vertical direction. The scan lines and the data lines overlap with each other to form the pixel areas. The pixel structure further includes a connection electrode coupled to pixel areas. The connection electrode includes a first connection layer and a second connection layer. The first connection layer is in the same pattern layer as the scan lines and intersects with the scan lines. The first connection layer at an intersecting position with the scan line is disconnected. The second connection layer is in the same pattern layer as the data lines and crosses the scan lines.

13 Claims, 3 Drawing Sheets

(51) Int. Cl.
G02F 1/1333 (2006.01)
G02F 1/1343 (2006.01)
H01L 27/12 (2006.01)
*G06F 3/041* (2006.01)
*G06F 3/044* (2006.01)
*H01L 29/786* (2006.01)

(52) U.S. Cl.
CPC ............ *G06F 3/044* (2013.01); *G06F 3/0412* (2013.01); *G06F 2203/04103* (2013.01); *H01L 29/78678* (2013.01)

PIXEL STRUCTURE, ARRAY SUBSTRATE AND DISPLAY DEVICE

CROSS REFERENCE

This is a divisional application of co-pending U.S. patent application Ser. No. 14/783,927, filed on Oct. 12, 2015, which is a national stage of PCT Application No. PCT/CN2015/083648, filed on Jul. 9, 2015, claiming foreign priority of Chinese Patent Application No. 201510362528.8, entitled "Pixel structure, array substrate and display device", filed on Jun. 26, 2015, the disclosure of which is incorporated herein by reference in its entirety.

FIELD OF THE INVENTION

The present invention relates to a display technology field, and more particularly to a pixel structure, an array substrate having the pixel structure and a display device applied with the array substrate.

BACKGROUND OF THE INVENTION

With the constant development of the touch screen technology, Touch and Display are no longer two independent forms of technology. More and more makers of the Thin Film Transistor-Liquid Crystal Display (TFT-LCD) start to try to combine Touch and Display, such as In-Cell Touch, One Glass Solution (OGS), On-Cell Touch and Hybrid In-Cell Touch. The touch technology of combining Touch and Display seems to race to emerge.

In comparison with OGS, On-Cell Touch or Hybrid In-Cell Touch panels, the In-Cell Touch panel possesses advantages of lighter, lesser process flow and more stable structure. The In-Cell Touch is to integrate all the touch control circuits inside the LCD without additionally being attached Touch Sensor Glass or more On-Cell process on the LCD. Accordingly, the integration and the shortening of the production flow and the production time can be achieved, which can make bigger profits for the LCD makers. Meanwhile, by utilizing the stepper of high resolution, the In-Cell Touch panel with higher resolution can be realized and the Moire interference can be effectively prevented. Thus, the In-Cell Touch panel will be the mainstream direction for the development of the small and medium size touch control panel in the future.

In the production process of the In-Cell Touch panel, the electrodes and the wirings for touch control display have to be designed on the array substrate, such as the Low Temperature Poly-silicon (LTPS) array. The array process is much more complicated than the process of the traditional amorphous silicon (α-Si). The integration of the In-Cell Touch and the LTPS does not only make the array process more complicated, longer production period but also has more strict demands for the array process.

The In-Cell Touch panels can be divided into the self capacitance type and the mutual capacitance type. Both need the connection electrodes for coupling the pixel areas. Thus, one or more Photo Engraving Process (PEP) is added for manufacturing the connection electrodes for coupling the pixel areas (or so called Metal3 or M3) and the corresponding insulation layer. The added M3 manufacture process can create risk to the yield of the product because the etching process of M3 may cause the Mura defects. However, in the In-Cell Touch technology, M3 has to be utilized for coupling the pixel areas. Therefore, the yield promotion of the In-Cell Touch panel is restricted in a certain extent.

SUMMARY OF THE INVENTION

The present invention provides a pixel structure, utilizing the present gate metal and source/drain metal to manufacture the connection electrodes employed to couple the pixel areas for simplifying the array substrate manufacture process to reduce the risk of generating strip defects and to promote the product yield.

Besides, the present invention further provides an array substrate applied with the pixel structure.

Besides, the present invention further provides a display device applied with the pixel structure.

A pixel structure, comprising scan lines, data lines and pixel areas, and the scan lines are separately arranged in parallel along a horizontal direction, and the data lines are separately arranged in parallel along a vertical direction, and the scan lines and the data lines overlap with each other to form the pixel areas, wherein the pixel structure further comprises a connection electrode employed to coupled to pixel areas, and the connection electrode comprises a first connection layer and a second connection layer, and the first connection layer is in the same pattern layer with the scan lines and intersects with the scan lines, and the first connection layer at an intersecting position with the scan line is disconnected, and the second connection layer is in the same pattern layer with the data lines and crosses with the scan lines, and two sides of the first connection layer at the intersecting position with the scan line are electrically coupled to the second connection layer through a first via hole.

The first connection layer is located below the data line, and the two sides of the first connection layer at a disconnected position by the scan line extend a distance along a direction parallel with a direction of the scan line to respectively form a connection end at two sides of the disconnected position, and two ends of the second connection layer overlap with portions of the connection ends in a normal projection direction, and are electrically coupled to the connection ends through the first via holes.

The pixel structure further comprises a thin film transistor, a common electrode and a pixel electrode, and the thin film transistor is formed at an overlapping position of the scan line and the data line, and the thin film transistor comprises a gate, a polysilicon layer, a source and a drain, the gate is electrically coupled to the scan line, and the polysilicon layer is located above the gate, and the source and the drain are located above the polysilicon layer, and electrically coupled to the polysilicon layer through a second via hole, respectively, and the common electrode is electrically coupled to the second connection layer through a third via hole, and the pixel electrode is electrically coupled to the drain through a third via hole and a fourth via hole.

The pixel structure further comprises a substrate and a first insulation layer, a second insulation layer, a third insulation layer and a fourth insulation layer which stack up on the substrate in sequence, and the gate and the first connection layer are separately located on the substrate, and the first insulation layer is located above the gate and the first connection layer, and the polysilicon layer is located above the first connection layer, and aligned with the gate in a normal projection direction, and the second insulation layer is located above the polysilicon layer, and the third insulation layer is located above the second insulation layer, and the common electrode is located above the third insulation layer, and the fourth insulation layer is located above the common electrode, and the pixel electrode is located above the fourth insulation layer.

The source, the drain and the second connection layer are located in the third insulation layer, and the source overlaps with a portion of one end of the polysilicon layer in the normal projection direction, and the drain overlaps with a portion of the other end of the polysilicon layer in the normal projection direction, and the second connection layer is above the first connection layer, and overlaps with a portion of the first connection layer in the normal projection direction.

The polysilicon layer comprises a first connection section, a second connection section and a third connection section, and the first connection section and the third connection section are separately located in parallel with each other and crossing the scan line, and the second connection section is coupled between two ends of the first connection section and the third connection section at the same side of the scan line, and parallel with the scan line.

The first connection layer and the gate, the scan line are in the same pattern layer, and the second connection layer and the source, the drain, the data line are in the same pattern layer, and the first connection layer and the gate, the scan line are formed simultaneously in the same manufacture process, and the second connection layer and the source, the drain, the data line are formed simultaneously in the same manufacture process.

The present invention further provides an array substrate, comprising a plurality of scan lines, a plurality of data lines and a plurality of pixel areas, and the scan lines are separately arranged in parallel along a horizontal direction, and the data lines are separately arranged in parallel along a vertical direction, and the scan lines and the data lines overlap with each other to form the pixel areas, wherein the array substrate further comprises a connection electrode employed to coupled to pixel areas, and the connection electrode comprises a first connection layer and a second connection layer, and the first connection layer is in the same pattern layer with the scan lines and intersects with the scan lines, and the first connection layer at an intersecting position with the scan line is disconnected, and the second connection layer is in the same pattern layer with the data lines and crosses with the scan lines, and two sides of the first connection layer at the intersecting position with the scan line are electrically coupled to the second connection layer through a first via hole.

The first connection layer is located below the data line, and the two sides of the first connection layer at a disconnected position by the scan line extend a distance along a direction parallel with a direction of the scan line to respectively form a connection end at two sides of the disconnected position, and two ends of the second connection layer overlap with portions of the connection ends in a normal projection direction, and are electrically coupled to the connection ends through the first via holes.

The array substrate further comprises a plurality of thin film transistors, a plurality of common electrodes and a plurality of pixel electrodes, and the plurality of thin film transistor is formed at an overlapping position of the scan line and the data line, and each of thin film transistors comprises a gate, a polysilicon layer, a source and a drain, the gate is electrically coupled to the scan line, and the polysilicon layer is located above the gate, and the source and the drain are located above the polysilicon layer, and electrically coupled to the polysilicon layer through a second via hole, respectively, and the common electrode is electrically coupled to the second connection layer through a third via hole, and the pixel electrode is electrically coupled to the drain through a third via hole and a fourth via hole.

The array substrate further comprises a substrate and a first insulation layer, a second insulation layer, a third insulation layer and a fourth insulation layer which stack up on the substrate in sequence, and the gate and the first connection layer are separately located on the substrate, and the first insulation layer is located above the gate and the first connection layer, and the polysilicon layer is located above the first connection layer, and aligned with the gate in a normal projection direction, and the second insulation layer is located above the polysilicon layer, and the third insulation layer is located above the second insulation layer, and the common electrode is located above the third insulation layer, and the fourth insulation layer is located above the common electrode, and the pixel electrode is located above the fourth insulation layer.

The source, the drain and the second connection layer are located in the third insulation layer, and the source overlaps with a portion of one end of the polysilicon layer in the normal projection direction, and the drain overlaps with a portion of the other end of the polysilicon layer in the normal projection direction, and the second connection layer is above the first connection layer, and overlaps with a portion of the first connection layer in the normal projection direction.

The polysilicon layer comprises a first connection section, a second connection section and a third connection section, and the first connection section and the third connection section are separately located in parallel with each other and crossing the scan line, and the second connection section is coupled between two ends of the first connection section and the third connection section at the same side of the scan line, and parallel with the scan line.

The first connection layer and the gate, the scan line are in the same pattern layer, and the second connection layer and the source, the drain, the data line are in the same pattern layer, and the first connection layer and the gate, the scan line are formed simultaneously in the same manufacture process, and the second connection layer and the source, the drain, the data line are formed simultaneously in the same manufacture process.

The present invention further provides a display device, comprising an array substrate, wherein the array substrate comprises a plurality of scan lines, a plurality of data lines and a plurality of pixel areas, and the scan lines are separately arranged in parallel along a horizontal direction, and the data lines are separately arranged in parallel along a vertical direction, and the scan lines and the data lines overlap with each other to form the pixel areas, wherein the array substrate further comprises a connection electrode employed to coupled to pixel areas, and the connection electrode comprises a first connection layer and a second connection layer, and the first connection layer is in the same pattern layer with the scan lines and intersects with the scan lines, and the first connection layer at an intersecting position with the scan line is disconnected, and the second connection layer is in the same pattern layer with the data lines and crosses with the scan lines, and two sides of the first connection layer at the intersecting position with the scan line are electrically coupled to the second connection layer through a first via hole.

The first connection layer is located below the data line, and the two sides of the first connection layer at a disconnected position by the scan line extend a distance along a direction parallel with a direction of the scan line to respectively form a connection end at two sides of the disconnected position, and two ends of the second connection layer overlap with portions of the connection ends in a normal projection direction, and are electrically coupled to the connection ends through the first via holes.

The array substrate further comprises a plurality of thin film transistors, a plurality of common electrodes and a plurality of pixel electrodes, and the plurality of thin film transistor is formed at an overlapping position of the scan line and the data line, and each of thin film transistors comprises a gate, a polysilicon layer, a source and a drain, the gate is electrically coupled to the scan line, and the polysilicon layer is located above the gate, and the source and the drain are located above the polysilicon layer, and electrically coupled to the polysilicon layer through a second via hole, respectively, and the common electrode is electrically coupled to the second connection layer through a third via hole, and the pixel electrode is electrically coupled to the drain through a third via hole and a fourth via hole.

The array substrate further comprises a substrate and a first insulation layer, a second insulation layer, a third insulation layer and a fourth insulation layer which stack up on the substrate in sequence, and the gate and the first connection layer are separately located on the substrate, and the first insulation layer is located above the gate and the first connection layer, and the polysilicon layer is located above the first connection layer, and aligned with the gate in a normal projection direction, and the second insulation layer is located above the polysilicon layer, and the third insulation layer is located above the second insulation layer, and the common electrode is located above the third insulation layer, and the fourth insulation layer is located above the common electrode, and the pixel electrode is located above the fourth insulation layer.

The source, the drain and the second connection layer are located in the third insulation layer, and the source overlaps with a portion of one end of the polysilicon layer in the normal projection direction, and the drain overlaps with a portion of the other end of the polysilicon layer in the normal projection direction, and the second connection layer is above the first connection layer, and overlaps with a portion of the first connection layer in the normal projection direction.

The polysilicon layer comprises a first connection section, a second connection section and a third connection section, and the first connection section and the third connection section are separately located in parallel with each other and crossing the scan line, and the second connection section is coupled between two ends of the first connection section and the third connection section at the same side of the scan line, and parallel with the scan line.

In the pixel structure of the present invention, by forming the first connection layer and the gate, the scan line simultaneously in the same manufacture process, and forming the drain, the data line simultaneously in the same manufacture process, the first connection layer and the second connection layer are electrically coupled through the first via hole in advance to form the connection electrodes employed for coupling the pixel areas. Thus, one or more independent manufacture process is not required to form the connection electrodes. The process flow is simplified to reduce the risk of generating strip defects and to promote the product yield.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Spatially relative terms, such as "below", "beneath", "lower", "above", "upper" and the like, may be used herein for ease of description to describe one element or feature's relationship to another element(s) or feature as illustrated in the figures. It will be understood that when an element or layer is referred to as being "on", "connected to" or "coupled to" another element or layer, it can be directly on the other element or layer or intervening elements or layers may be present. In contrast, when an element is referred to as being "directly on", "directly connected to" or "directly coupled to" another element or layer, there are no intervening elements or layers present.

It is understandable that the terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. Unless otherwise defined, all terms (including technical and scientific terms) used herein have the same meaning as commonly understood by one of ordinary skill in the art to which example embodiments belong.

Figure 1:
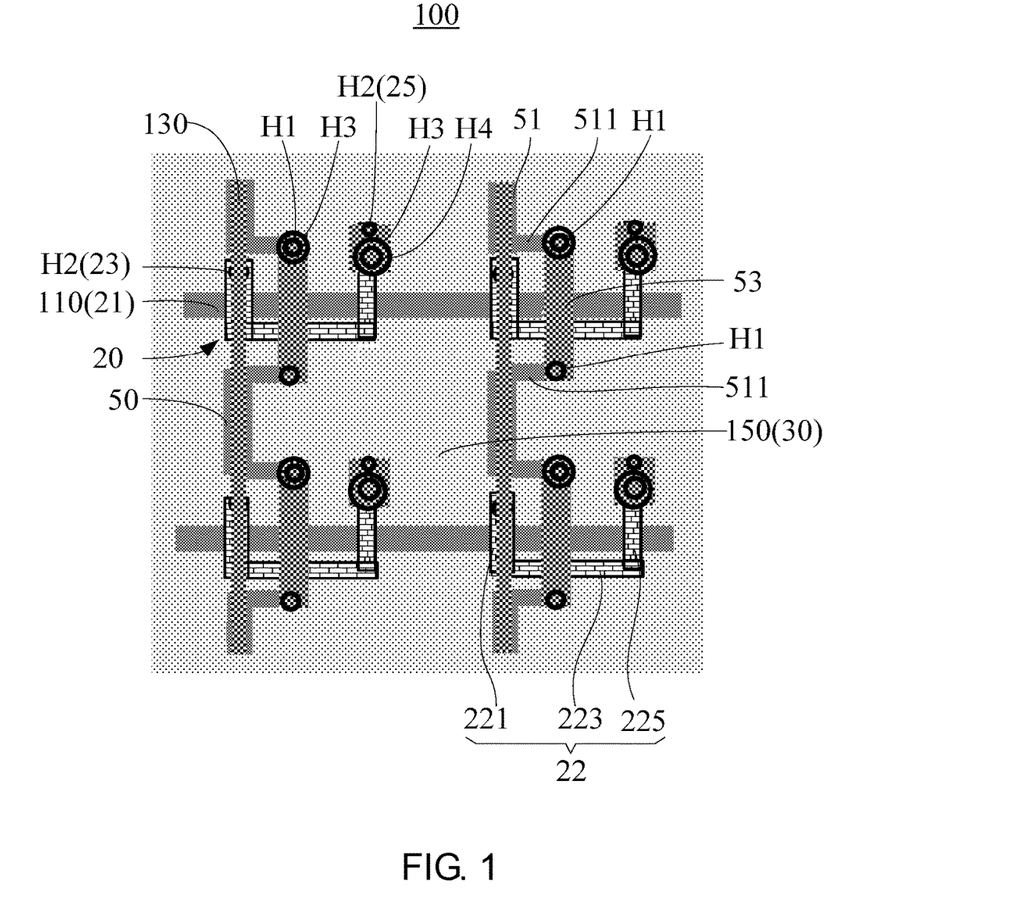
FIG. 1 is a plane structure diagram of a pixel structure according to the first embodiment of the present invention.

Please refer to FIG. 1. The present invention provides a pixel structure 100, utilizing the present gate metal and source/drain metal to manufacture the connection electrodes employed to couple the pixel areas for simplifying the manufacture process to reduce the risk of generating strip defects and to promote the product yield.

The pixel structure 100 comprises scan lines 110, data lines 130, pixel areas 150 and connection electrodes 50 employed to couple the pixel areas 150. The scan lines 110 are separately arranged in parallel along a horizontal direction, and the data lines 130 are separately arranged in parallel along a vertical direction, and two adjacent scan lines 110 and two adjacent data lines 130 overlap with each other to form one pixel area 150.

The connection electrode 50 comprises a first connection layer 51 and a second connection layer 53. The first connection layer 51 and the scan lines 110 are in the same pattern layer and the second connection layer 53 and the data lines 130 are in the same pattern layer. The first connection layer 51 intersects with the scan lines 110, and the first connection layer at an intersecting position with the scan line 110 is disconnected by the scan line 110. The second connection layer 53 is located in parallel with the data lines 130 and crosses with the scan lines 110. Two sides of the first connection layer 51 at the intersecting position are electrically coupled to the second connection layer 53 through a first via hole H1. Namely, the two sides of the first connection layer 51 at two sides of the scan line 110 are electrically coupled to the second connection layer 53 through the first via hole H1. Thus, the first connection layers 51 in various pixel areas 150 are electrically coupled with one another to form the connection electrodes 50 for connecting the various pixel areas 150.

In this embodiment, the first connection layer 51 is located below the data line 130, and the two sides of the first connection layer at a disconnected position by the scan line 110 extend a distance along a direction parallel with a direction of the scan line 110 to respectively form a connection end 511 at two sides of the disconnected position. Two ends of the second connection layer 53 overlap with the connection ends 511 of the two sides of the first connection layer 51 at the disconnected position by the scan line 110 in the normal projection direction, and are electrically coupled to the connection ends 511 through the first via hole H1.

Figure 2:
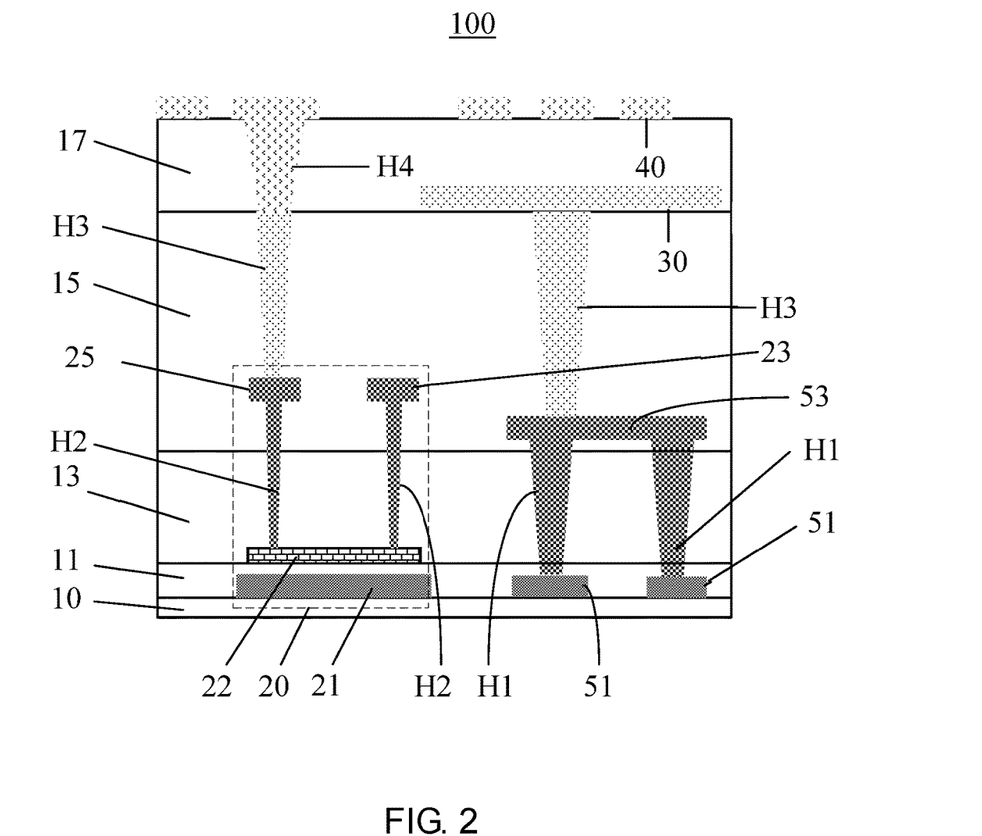
FIG. 2 is a sectional structure diagram of the pixel structure shown in FIG. 1.

Please refer to FIG. 2 together. FIG. 2 is a sectional structure diagram of the pixel structure 100 shown in FIG. 1. Specifically, the sectional structure diagram of FIG. 2 is not obtained by strictly slicing the plane structure diagram of the pixel structure 100 shown in FIG. 1 in some direction. Therefore, FIG. 2 is merely to explain the internal structure of the pixel structure 100 with combination of FIG. 1 in advance.

The pixel structure 100 further comprises a substrate 10 and a first insulation layer 11, a second insulation layer 13, a third insulation layer 15 and a fourth insulation layer 17 which stack up on the substrate 1 in sequence, and a thin film transistor 20, a common electrode 30 and a pixel electrode 40.

The thin film transistor 20 comprises a gate 21, a polysilicon layer 22, a source 23 and a drain 25. The gate 21 and the first connection layer 51 of the connection electrode 50 are separately located on the substrate 10. The first insulation layer 11 is located above the gate 21 and the first connection layer 51. The polysilicon layer 22 is located above the first connection layer 11, and roughly aligned with the gate 21 in a normal projection direction. The second insulation layer 13 is located above the polysilicon layer 22, and closely adhered to the polysilicon layer 22. The third insulation layer 15 is located above the second insulation layer 13. The source 23, the drain 25 and the second connection layer 53 of the connection electrode 50 are located in the third insulation layer 15. The source 23 and the drain 25 are located above the polysilicon layer 22, and the source 23 overlaps with a portion of one end of the gate 21 and the polysilicon layer 22 in the normal projection direction. The drain 25 overlaps with a portion of the other end of the gate 21 and the polysilicon layer 22 in the normal projection direction. The source 23 and the drain 25 are electrically coupled to the opposite two ends of the polysilicon layer 22 respectively through a second via hole H2. The second connection layer 53 is above the first connection layer 51, and overlaps with a portion of the first connection layer 51 in the normal projection direction. Two sides of the second connection layer 53 are electrically coupled to the first connection layer 51 respectively through a first via hole H1.

The common electrode 30 is located above the third insulation layer 15, and electrically coupled to the second connection layer 53 through a third via hole H3. The fourth insulation layer 17 is located above the common electrode 30. The pixel electrode 40 is located above the fourth insulation layer 17, and electrically coupled to the drain 25 of the thin film transistor 20 though a fourth via hole H4 penetrating the fourth insulation layer 17 and the third via hole H3 penetrating a portion of the third insulation layer 15.

Please refer to FIG. 1, again. The thin film transistor 20 is formed at an overlapping position of the scan line 110 and the data line 130. The gate 21 is at the same patter layer with the scan line 110, and electrically coupled to the scan line 110. The polysilicon layer 22 appears to be a rough U shape, which comprises a first connection section 221, a second connection section 223 and a third connection section 225. The first connection section 221 and the third connection section 225 are separately located in parallel with each other and crossing the scan line 110. The second connection section 223 is coupled between two ends of the first connection section 221 and the third connection section 225 at the same side of the scan line 110, and parallel with the scan line 110. The source 23, the drain 25 are respectively located above ends of the first connection section 221 and the third connection section 225 away from the second connection section 223 (i.e. the source 23, the drain 25 are respectively located at two ends of the first connection section 221 and the third connection section 225 at the other side relative to the scan line 110), and electrically coupled to the first connection section 221 and the third connection section 225 through the second via hole H2, respectively. The source 23 is in the same pattern layer with the data line 130, and electrically coupled to the data line 130. The drain 25 is electrically coupled to the pixel electrode (not shown) through the third via hole H3 and the fourth via hole H4. The common electrode 30 is electrically coupled to the second connection layer 53 through the third via hole H3. It is understandable that in FIG. 1 of this application, the positions of the source 23 and the second via hole H2 overlap. Therefore, the two are indicated with one line. Similarly, the gate 21 and the scan line 110 in FIG. 1 are indicated with one line, and the drain 25 and the second via hole H2 are indicated with one line, and the pixel area 150 and the common electrode 30 are also indicated with one line.

It is understandable that the first connection layer 51 is in the same pattern layer with the gate 21, the scan line 110, and the second connection layer 53 is in the same pattern layer with the source 23, the drain 25, the data line 130. Thus, the first connection layer 51 and the gate 21, the scan line 110 are formed simultaneously in the same manufacture process, and the second connection layer 53 and the source 23, the drain 25, the data line 130 are formed simultaneously in the same manufacture process. Furthermore, the first connection layer 51 and the second connection layer 53 are electrically coupled through the first via hole H1 to form the connection electrode 50 employed for coupling the pixel areas 150.

Thus, one or more independent manufacture process is not required to form the connection electrodes 50. The process flow is simplified.

Figure 3:
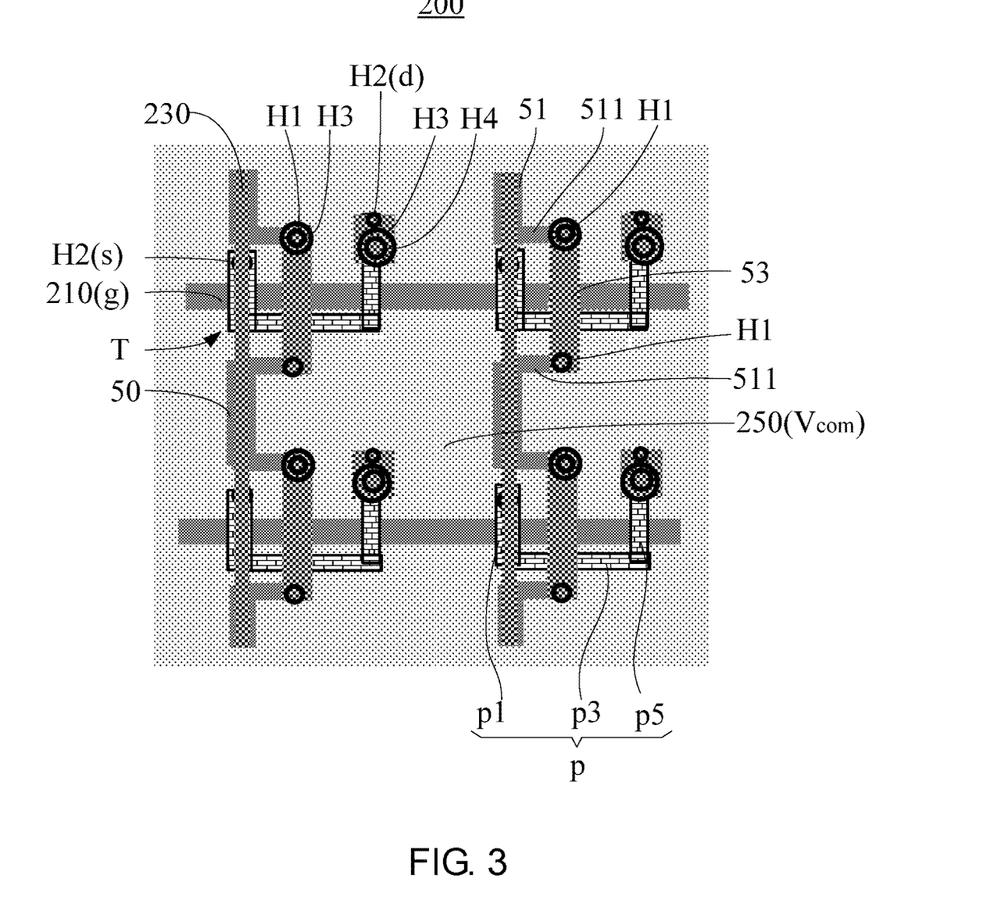
FIG. 3 is a plane structure diagram of an array substrate according to the second embodiment of the present invention.

Please refer to FIG. 3. The second embodiment of the present invention provides an array substrate 200, of which the pixel structure 100 shown in FIG. 1 and FIG. 2 are applied. The array substrate 200 comprises a plurality of scan lines 210, a plurality of data lines 230 and a plurality of pixel areas 250. The scan lines 210 are separately arranged in parallel along a horizontal direction, and the data lines 230 are separately arranged in parallel along a vertical direction, and two adjacent scan lines 210 and two adjacent data lines 230 overlap with each other to form one pixel area 250.

The array substrate 200 further comprises a plurality of connection electrode 50 employed to coupled to pixel areas 250. The connection electrode 50 comprises a first connection layer 51 and a second connection layer 53. The first connection layer 51 and the scan lines 210 are in the same pattern layer and the second connection layer 53 and the data lines 230 are in the same pattern layer. The first connection layer 51 intersects with the scan lines 210, and the first connection layer at an intersecting position with the scan line 210 is disconnected by the scan line 210. The second connection layer 53 is located in parallel with the data lines 230 and crosses with the scan lines 210. Two sides of the first connection layer 51 at the intersecting position are electrically coupled to the second connection layer 53 through a first via hole H1. Namely, the two sides of the first connection layer 51 at two sides of the scan line 210 are electrically coupled to the second connection layer 53 through the first via hole H1. Thus, the first connection layers 51 in various pixel areas 250 are electrically coupled with one another to form the connection electrodes 50 for connecting the various pixel areas 250.

In this embodiment, the first connection layer 51 is located below the data line 230, and the two sides of the first connection layer at a disconnected position by the scan line 210 extend a distance along a direction parallel with a direction of the scan line 210 to respectively form a connection end 511 at two sides of the disconnected position. Two ends of the second connection layer 53 overlap with the connection ends 511 of the two sides of the first connection layer 51 at the disconnected position by the scan line 210 in the normal projection direction, and are electrically coupled to the connection ends 511 through the first via hole H1.

The array substrate 200 further comprises a plurality of thin film transistors T, a plurality of common electrodes Vcom and a plurality of pixel electrodes (not shown). The plurality of thin film transistors T are formed at overlapping positions of the scan lines 210 and the data lines 230. Each of the thin film transistors T comprises a gate g, a polysilicon layer p, a source s and a drain d. The gate g is in the same pattern layer with the scan lines 210, and electrically coupled to the scan line 210. The polysilicon layer p appears to be a rough U shape, which comprises a first connection section p1, a second connection section p3 and a third connection section p5. The first connection section p1 and the third connection section p5 are separately located in parallel with each other and crossing the scan line 210. The second connection section p3 is coupled between two ends of the first connection section p1 and the third connection section p5 at the same side of the scan line 210, and parallel with the scan line 210. The source s, the drain d are respectively located above ends of the first connection section p1 and the third connection section p5 away from the second connection section p3 (i.e. the source s, the drain d are respectively located at two ends of the first connection section p1 and the third connection section p5 at the other side relative to the scan line 210), and electrically coupled to the first connection section p1 and the third connection section p5 through the second via hole H2, respectively. The common electrode Vcom is electrically coupled to the second connection layer 53 through a third via hole H3. The source s is in the same pattern layer with the data line 230, and electrically coupled to the data line 230. The drain d is electrically coupled to the pixel electrode (not shown) through the third via hole H3 and the fourth via hole H4. It is understandable that in FIG. 3 of this application, the positions of the source s and the second via hole H2 overlap. Therefore, the two are indicated with one line. Similarly, the gate g and the scan line 210 in FIG. 3 are indicated with one line, and the drain d and the second via hole H2 are indicated with one line, and the pixel area 250 and the common electrode Vcom are also indicated with one line.

It is understandable that the first connection layer 51 is in the same pattern layer with the gate g, the scan line 210, and the second connection layer 53 is in the same pattern layer with the source s, the drain d, the data line 230. Thus, the first connection layer 51 and the gate g, the scan line 210 are formed simultaneously in the same manufacture process, and the second connection layer 53 and the source s, the drain d, the data line 230 are formed simultaneously in the same manufacture process. Furthermore, the first connection layer 51 and the second connection layer 53 are electrically coupled through the first via hole H1 to form the connection electrode 50 employed for coupling the pixel areas 250. Thus, one or more independent manufacture process is not required to form the connection electrodes 50. The process flow of the array substrate 200 is simplified.

Besides, the present invention further provides a display device of which the array substrate 200 is applied. Thus, the first connection layer 51 and the gate g, the scan line 210 are formed simultaneously in the same manufacture process, and the second connection layer 53 and the source s, the drain d, the data line 230 are formed simultaneously in the same manufacture process. Then, the first connection layer 51 and the second connection layer 53 are electrically coupled through the first via hole H1 to form the connection electrode 50 employed for coupling the pixel areas 250. Thus, one or more independent manufacture process is not required to form the connection electrodes 50. The process flow of the display device is simplified to reduce the risk of generating strip defects and to promote the product yield.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate, comprising a plurality of scan lines, a plurality of data lines and a plurality of pixel areas, and the scan lines are separately arranged in parallel along a horizontal direction, and the data lines are separately arranged in parallel along a vertical direction, and the scan lines and the data lines overlap with each other to form the pixel areas, wherein the array substrate further comprises a connection electrode coupled to the pixel areas for sensing touches to the pixel areas, and the connection electrode comprises a first connection layer and a second connection layer, and the first connection layer is in the same pattern layer with the scan lines and intersects with the scan lines, and the first connection layer at an intersecting position with the scan line is disconnected, and the second connection layer is in the same pattern layer with the data lines and crosses with the scan lines, and two sides of the first connection layer at the intersecting position with the scan line are electrically coupled to the second connection layer through a first via hole.

2. The array substrate according to claim 1, wherein the first connection layer is located below the data line, and the two sides of the first connection layer at a disconnected position by the scan line extend a distance along a direction parallel with a direction of the scan line to respectively form a connection end at two sides of the disconnected position, and two ends of the second connection layer overlap with portions of the connection ends in a normal projection direction, and are electrically coupled to the connection ends through the first via holes.

3. The array substrate according to claim 1, wherein the array substrate further comprises a plurality of thin film transistors, a plurality of common electrodes and a plurality of pixel electrodes, and the plurality of thin film transistor is formed at an overlapping position of the scan line and the data line, and each of thin film transistors comprises a gate, a polysilicon layer, a source and a drain, the gate is electrically coupled to the scan line, and the polysilicon layer is located above the gate, and the source and the drain are located above the polysilicon layer, and electrically coupled to the polysilicon layer through a second via hole, respectively, and the common electrode is electrically coupled to the second connection layer through a third via hole, and the pixel electrode is electrically coupled to the drain through a third via hole and a fourth via hole.

4. The array substrate according to claim 3, wherein the array substrate further comprises a substrate and a first insulation layer, a second insulation layer, a third insulation layer and a fourth insulation layer which stack up on the substrate in sequence, and the gate and the first connection layer are separately located on the substrate, and the first insulation layer is located above the gate and the first connection layer, and the polysilicon layer is located above the first connection layer, and aligned with the gate in a normal projection direction, and the second insulation layer is located above the polysilicon layer, and the third insulation layer is located above the second insulation layer, and the common electrode is located above the third insulation layer, and the fourth insulation layer is located above the common electrode, and the pixel electrode is located above the fourth insulation layer.

5. The array substrate according to claim 4, wherein the source, the drain and the second connection layer are located in the third insulation layer, and the source overlaps with a portion of one end of the polysilicon layer in the normal projection direction, and the drain overlaps with a portion of the other end of the polysilicon layer in the normal projection direction, and the second connection layer is above the first connection layer, and overlaps with a portion of the first connection layer in the normal projection direction.

6. The array substrate according to claim 3, wherein the polysilicon layer comprises a first connection section, a second connection section and a third connection section, and the first connection section and the third connection section are separately located in parallel with each other and crossing the scan line, and the second connection section is coupled between two ends of the first connection section and the third connection section at the same side of the scan line, and parallel with the scan line.

7. The array substrate according to claim 3, wherein the first connection layer and the gate, the scan line are in the same pattern layer, and the second connection layer and the source, the drain, the data line are in the same pattern layer, and the first connection layer and the gate, the scan line are formed simultaneously in the same manufacture process, and the second connection layer and the source, the drain, the data line are formed simultaneously in the same manufacture process.

8. A display device, comprising an array substrate, wherein the array substrate comprises a plurality of scan lines, a plurality of data lines and a plurality of pixel areas, and the scan lines are separately arranged in parallel along a horizontal direction, and the data lines are separately arranged in parallel along a vertical direction, and the scan lines and the data lines overlap with each other to form the pixel areas, wherein the array substrate further comprises a connection electrode coupled to the pixel areas for sensing touches to the pixel areas, and the connection electrode comprises a first connection layer and a second connection layer, and the first connection layer is in the same pattern layer with the scan lines and intersects with the scan lines, and the first connection layer at an intersecting position with the scan line is disconnected, and the second connection layer is in the same pattern layer with the data lines and crosses with the scan lines, and two sides of the first connection layer at the intersecting position with the scan line are electrically coupled to the second connection layer through a first via hole.

9. The display device according to claim 8, wherein the first connection layer is located below the data line, and the two sides of the first connection layer at a disconnected position by the scan line extend a distance along a direction parallel with a direction of the scan line to respectively form a connection end at two sides of the disconnected position, and two ends of the second connection layer overlap with portions of the connection ends in a normal projection direction, and are electrically coupled to the connection ends through the first via holes.

10. The display device according to claim 8, wherein the array substrate further comprises a plurality of thin film transistors, a plurality of common electrodes and a plurality of pixel electrodes, and the plurality of thin film transistor is formed at an overlapping position of the scan line and the data line, and each of thin film transistors comprises a gate, a polysilicon layer, a source and a drain, the gate is electrically coupled to the scan line, and the polysilicon layer is located above the gate, and the source and the drain are located above the polysilicon layer, and electrically coupled to the polysilicon layer through a second via hole, respectively, and the common electrode is electrically coupled to the second connection layer through a third via hole, and the pixel electrode is electrically coupled to the drain through a third via hole and a fourth via hole.

11. The display device according to claim 10, wherein the array substrate further comprises a substrate and a first insulation layer, a second insulation layer, a third insulation layer and a fourth insulation layer which stack up on the substrate in sequence, and the gate and the first connection layer are separately located on the substrate, and the first insulation layer is located above the gate and the first connection layer, and the polysilicon layer is located above the first connection layer, and aligned with the gate in a normal projection direction, and the second insulation layer is located above the polysilicon layer, and the third insulation layer is located above the second insulation layer, and the common electrode is located above the third insulation layer, and the fourth insulation layer is located above the common electrode, and the pixel electrode is located above the fourth insulation layer.

12. The display device according to claim 11, wherein the source, the drain and the second connection layer are located in the third insulation layer, and the source overlaps with a portion of one end of the polysilicon layer in the normal projection direction, and the drain overlaps with a portion of the other end of the polysilicon layer in the normal projection direction, and the second connection layer is above the first connection layer, and overlaps with a portion of the first connection layer in the normal projection direction.

13. The display device according to claim 10, wherein the polysilicon layer comprises a first connection section, a second connection section and a third connection section, and the first connection section and the third connection section are separately located in parallel with each other and crossing the scan line, and the second connection section is coupled between two ends of the first connection section and the third connection section at the same side of the scan line, and parallel with the scan line.

* * * * *